United States Patent [19]
Keeth

[11] Patent Number: 5,898,638
[45] Date of Patent: Apr. 27, 1999

[54] LATCHING WORDLINE DRIVER FOR MULTI-BANK MEMORY

[75] Inventor: Brent Keeth, Boise, Id.

[73] Assignee: Micron Technology, Inc., Boise, Id.

[21] Appl. No.: 08/815,195

[22] Filed: Mar. 11, 1997

[51] Int. Cl.[6] .................................................. G11C 8/00
[52] U.S. Cl. .............................. 365/230.06; 365/230.03
[58] Field of Search ........................ 365/230.03, 230.06

[56] References Cited

U.S. PATENT DOCUMENTS

| | | | |
|---|---|---|---|
| 4,096,402 | 6/1978 | Schroeder et al. ...................... | 307/362 |
| 4,404,474 | 9/1983 | Dingwall ................................ | 307/260 |
| 4,638,187 | 1/1987 | Boler et al. ............................ | 307/451 |
| 4,789,796 | 12/1988 | Foss ...................................... | 307/443 |
| 4,958,088 | 9/1990 | Farah-Bakhsh et al. .............. | 307/443 |
| 4,984,204 | 1/1991 | Sato et al. ............................. | 365/203 |
| 5,122,690 | 6/1992 | Bianchi ................................. | 307/475 |
| 5,128,560 | 7/1992 | Chern et al. .......................... | 307/475 |
| 5,128,563 | 7/1992 | Hush et al. ........................... | 307/482 |
| 5,150,186 | 9/1992 | Pinney et al. ......................... | 357/42 |
| 5,165,046 | 11/1992 | Hesson .................................. | 307/270 |
| 5,254,883 | 10/1993 | Horowitz et al. ..................... | 307/443 |
| 5,274,276 | 12/1993 | Casper et al. ......................... | 307/443 |
| 5,278,460 | 1/1994 | Casper .................................. | 307/296.5 |
| 5,311,481 | 5/1994 | Casper et al. ......................... | 365/230.06 |
| 5,347,177 | 9/1994 | Lipp ...................................... | 307/443 |
| 5,347,179 | 9/1994 | Casper et al. ......................... | 307/451 |
| 5,361,002 | 11/1994 | Casper .................................. | 327/530 |
| 5,400,283 | 3/1995 | Raad ..................................... | 365/203 |
| 5,438,545 | 8/1995 | Sim ....................................... | 365/189.05 |
| 5,473,575 | 12/1995 | Farmwald et al. ................... | 365/230.06 |
| 5,513,327 | 4/1996 | Farmwald et al. ................... | 395/309 |
| 5,568,077 | 10/1996 | Sato et al. ............................. | 327/199 |
| 5,574,698 | 11/1996 | Raad ..................................... | 365/230.06 |
| 5,578,941 | 11/1996 | Sher et al. ............................ | 326/34 |
| 5,694,065 | 12/1997 | Hamasaki et al. .................... | 327/108 |

FOREIGN PATENT DOCUMENTS

| | | |
|---|---|---|
| 0450871 | 10/1991 | European Pat. Off. . |
| 0655741 | 5/1995 | European Pat. Off. . |
| 0680049 | 11/1995 | European Pat. Off. . |
| 2-112317 | 4/1990 | Japan .............................. H03K 17/16 |
| 4-135311 | 8/1992 | Japan .............................. H03K 5/13 |
| 5-136664 | 1/1993 | Japan .............................. H03K 5/13 |
| 05282868 | 10/1993 | Japan . |

*Primary Examiner*—David Nelms
*Assistant Examiner*—Michael T. Tran
*Attorney, Agent, or Firm*—Seed and Berry LLP

[57] ABSTRACT

A memory device is described which includes latching wordline driver circuits. The wordline driver circuits include a latch responsive to phase lines of an address tree decode configuration. The latch has been described as a single latching transistor which allows transitions in shared row address lines while maintaining an active wordline signal. The latching wordline driver is particularly useful in multi-bank memory devices where row address lines are shared between the memory banks.

16 Claims, 6 Drawing Sheets

LATCHING WORDLINE DRIVER FOR MULTI-BANK MEMORY

TECHNICAL FIELD OF THE INVENTION

The present invention relates generally to integrated circuits and in particular the present invention relates to memory device wordline drivers.

BACKGROUND OF THE INVENTION

Integrated circuit memory devices typically include address inputs for receiving address signals to identify a memory location which is to be accessed for storing or retrieving data. The received address signals are decoded and used to access memory cell locations. In conventional memory devices, memory cells are accessed through access, or isolation Transistors. These Transistors are activated by a signal provided on a "wordline" coupled to a gate of the Transistor. As such, the signal on the wordline must remain valid while the memory cell is accessed. Because the wordline signal is typically generated using the address signals, if the address signals are changed during an access operation, memory data read or write operations may be prematurely interrupted resulting in a memory operation error.

For the reasons stated above, and for other reasons stated below which will become apparent to those skilled in the art upon reading and understanding the present specification, there is a need in the art for a memory device which latches a wordline signal to maintain access to memory locations while allowing externally provided address signals to change. In particular, memory devices which contain multiple banks of memory cells and share common address inputs will experience faster data access by allowing address signal changes to occur for a first memory bank while simultaneously maintaining access to a second memory bank.

SUMMARY OF THE INVENTION

The above mentioned problems with integrated circuit memories and other problems are addressed by the present invention and which will be understood by reading and studying the following specification. A memory is described which includes a latching wordline driver circuit.

In particular, the present invention describes a memory device comprising a multiple bank array of memory cells, access devices coupled to the memory cells for accessing the memory cells in response to a wordline signal, and a wordline driver circuit for generating the wordline signal in response to address signals. The wordline driver circuit includes a latch for latching an active state of the wordline signal so that the wordline signal becomes independent of transitions of the address signals.

In another embodiment, a memory device is described which comprises an array of memory cells, the array arranged in multiple banks of memory cell, address input lines shared between the multiple banks of memory cells for receiving address signals, decode circuitry for decoding the received address signals and generating phase signals, and access devices coupled to the memory cells for accessing the memory cells in response to a wordline signal. A wordline driver circuit is provided for generating the wordline signal in response to the received address signals, a bank dependant signal and the phase signals. The wordline driver circuit includes a latch for latching an active state of the wordline signal so that the wordline signal becomes independent of transitions of the address signals.

In one embodiment, the wordline driver circuit comprises a decode tree comprising a series of pass transistors coupled between a local phase line and an input of a level translator, the level translator having an output coupled to a wordline, a pulldown transistor having a drain connected to the wordline and a gate coupled to the local phase line, and a latch circuit coupled between the local phase line and the input of the level translator to latch a signal on the wordline.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
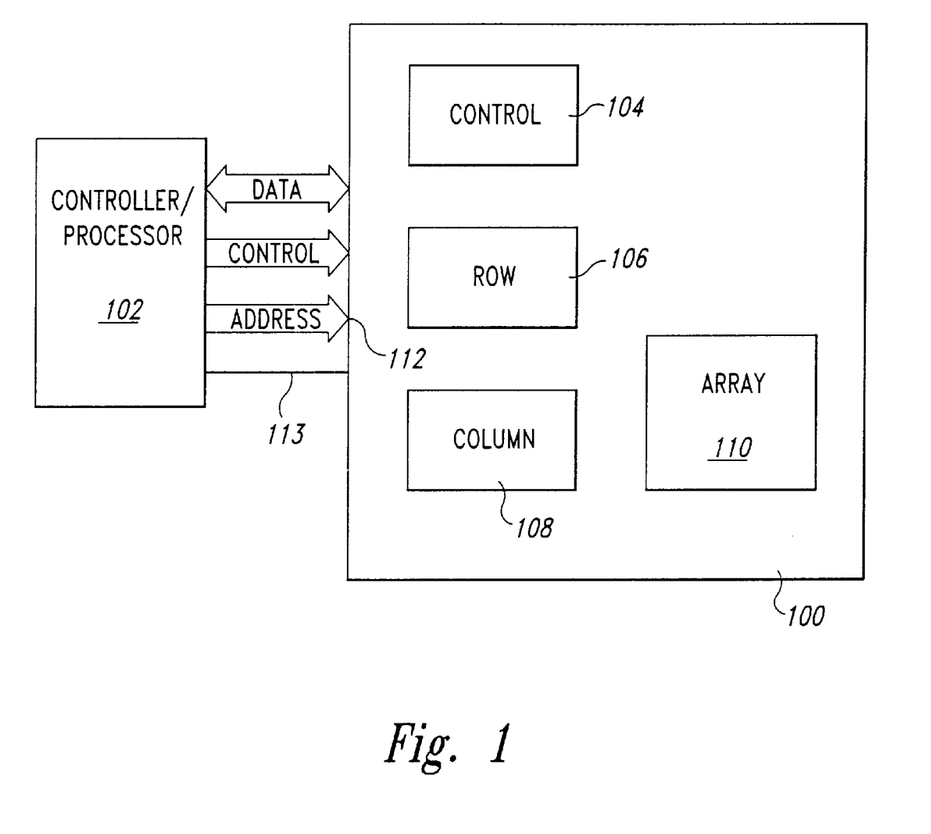
FIG. 1 is a block diagram of a memory device incorporating the present invention.

FIG. 1 is a block diagram of a synchronous memory device 100 such as an SDRAM which is coupled to an external circuit 102, such as a microprocessor. It is understood that in some applications a microprocessor is not directly connected to a memory, therefore, external circuit 102 can represent a memory controller coupled to a microprocessor. Further, although data, address and control lines are illustrated as separate buses, these communication lines can be combined in any manner without departing from the present invention. It will be appreciated that other multi-bank memories can utilize the present invention, such as SLDRAM, or RDRAM. The memory includes control circuitry 104, row decoder circuitry 106, column decoder circuitry 108, Input/Output circuitry 103 and an array of memory cells 110. The memory includes address inputs 112 for receiving address signals from the external circuit. Control signals are also provided for instructing control circuitry 114 to perform desired operations with the memory device, such as data read and write operations. A clock signal input line 113 is provided for receiving an externally provided clock signal for synchronizing memory operations.

Memory array 110 includes multiple banks of memory cells, or storage locations. These memory cells are arranged in rows and columns in each bank, and the banks are accessed via row decoder 106 using signals provided on address inputs 112. A more detailed illustration of one embodiment of array 110 is provided in FIG. 2.

Figure 2:
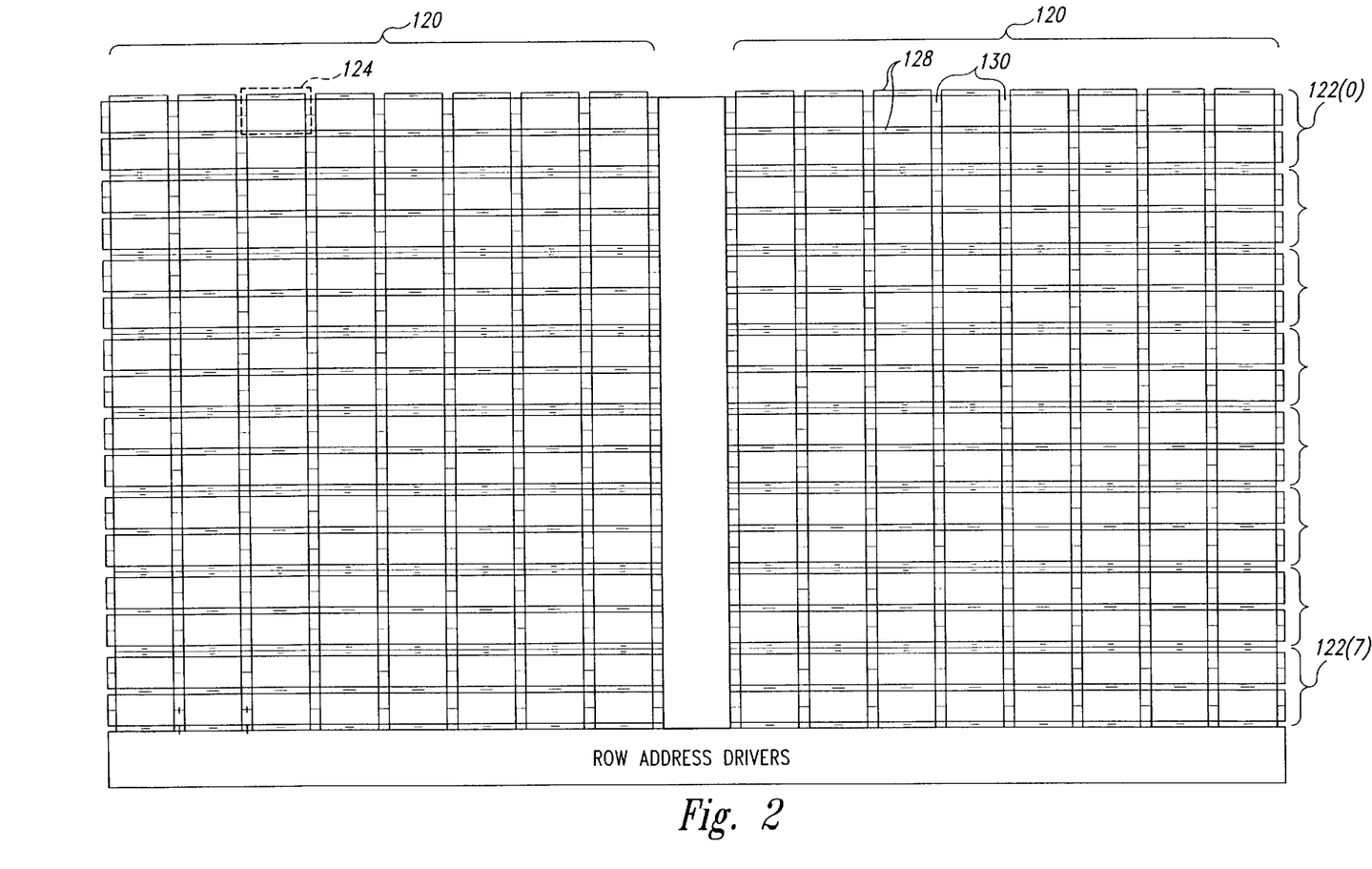
FIG. 2 is an illustration of one embodiment of a memory array of the memory device of FIG. 1.
Figure 3A:
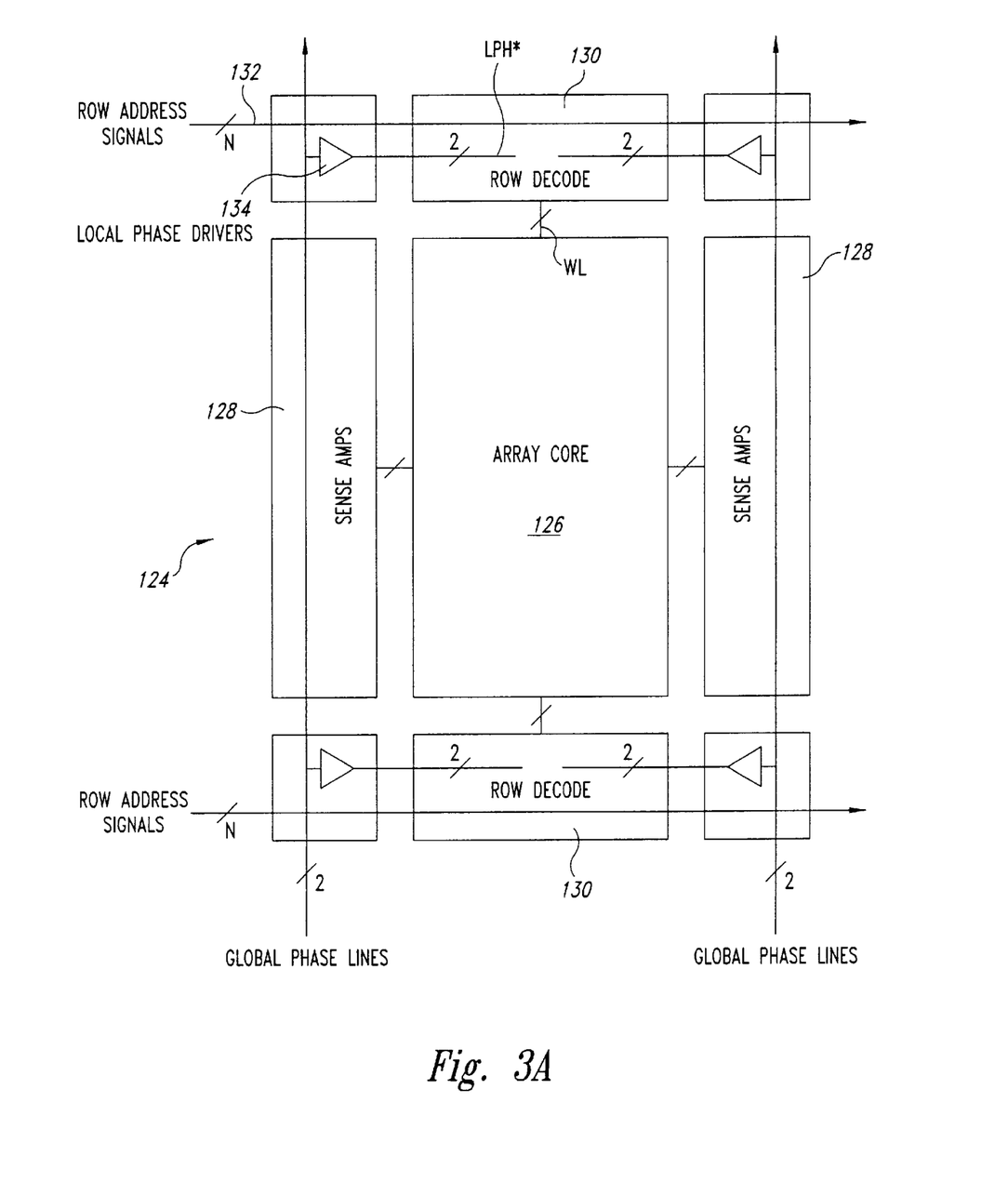
FIG. 3A is a more detailed illustration of part of the array of FIG. 2 showing phase lines.

In FIG. 2, a 64 mega bit array is shown as having two 32 meg subarrays 120 which are divided into eight banks 122(0)–(7). Each memory array bank is divided into sixteen sections 124 which include memory cells and row decode circuitry. Referring to FIG. 3A, a further description of one of the sections 124 is provided. Each section includes an array core 126 which includes memory cells and access devices, as known to those skilled in the art and illustrated in FIG. 4. In the preferred embodiment, the array core is coupled to two sense amplifier circuits 128. Row decode circuitry 130, generally illustrated in FIG. 1 as row decoder 106 for the entire memory, is provided to access memory cells of the core in response to row address signal lines 132 and local phase drivers 134.

Figure 3B:
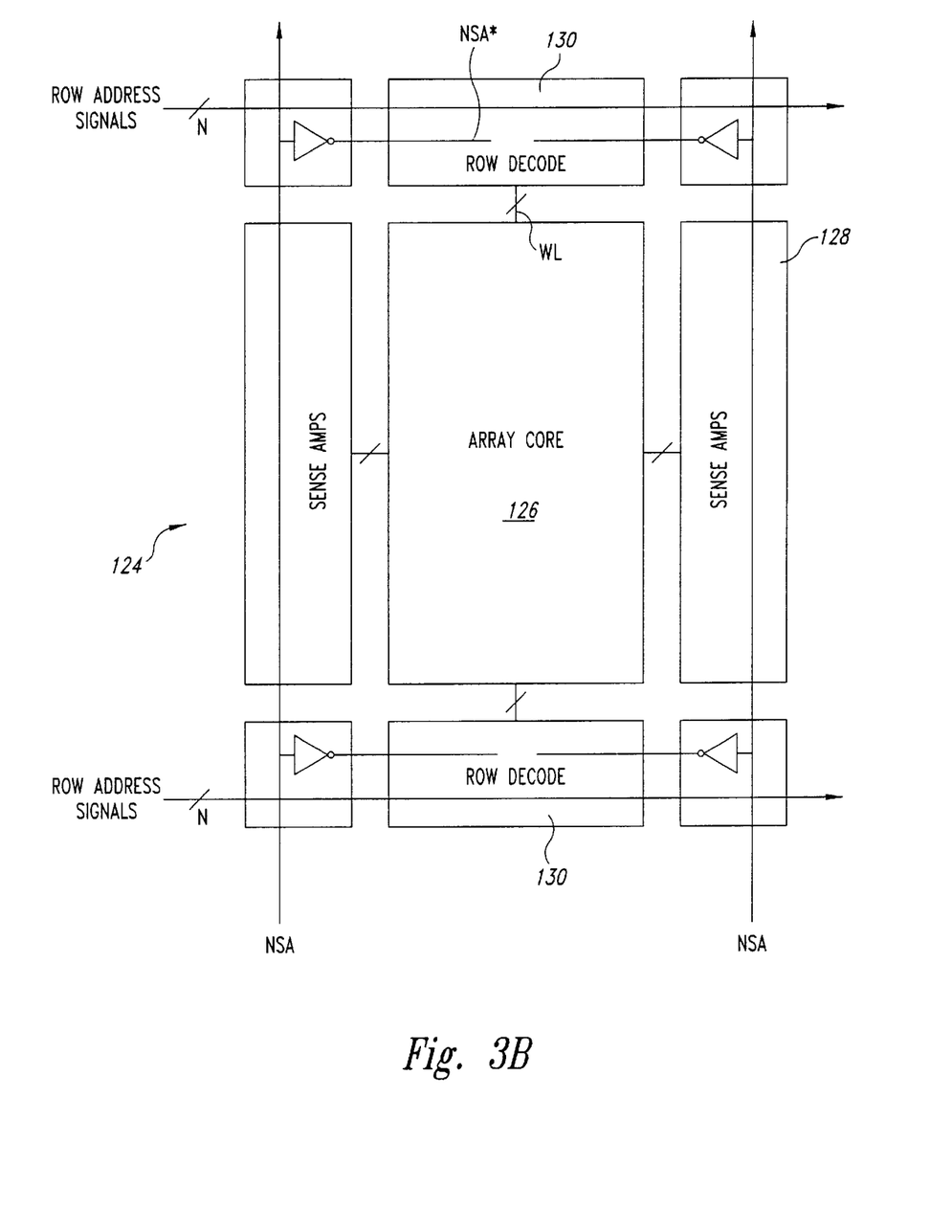
FIG. 3B is a more detailed illustration of part of the array of FIG. 2 showing sense amplifier activation lines.

The local phase drivers 134 provide signals which identify a portion of the array 110. By combining the row address lines and the local phase drivers in a tree decode scheme, a wordline can be controlled. For example, in one embodiment each array core 126 includes 512 rows of memory cells, each having a wordline associated with it. The row address lines provided in this embodiment can be decoded down to four wordlines. The local phase lines, LPH*, are then used to activate one of the four wordlines. Referring to FIG. 3B, a further description of one of the sections 124 is provided to illustrate an n-sense amplifier control, or activation, signal, NSA. The use of the NSA signal will be understood by the following description of FIG. 4. The elements of FIGS. 3A and 3B should be read as combined in the memory, and are illustrated in separate figures for simplicity.

Figure 4:
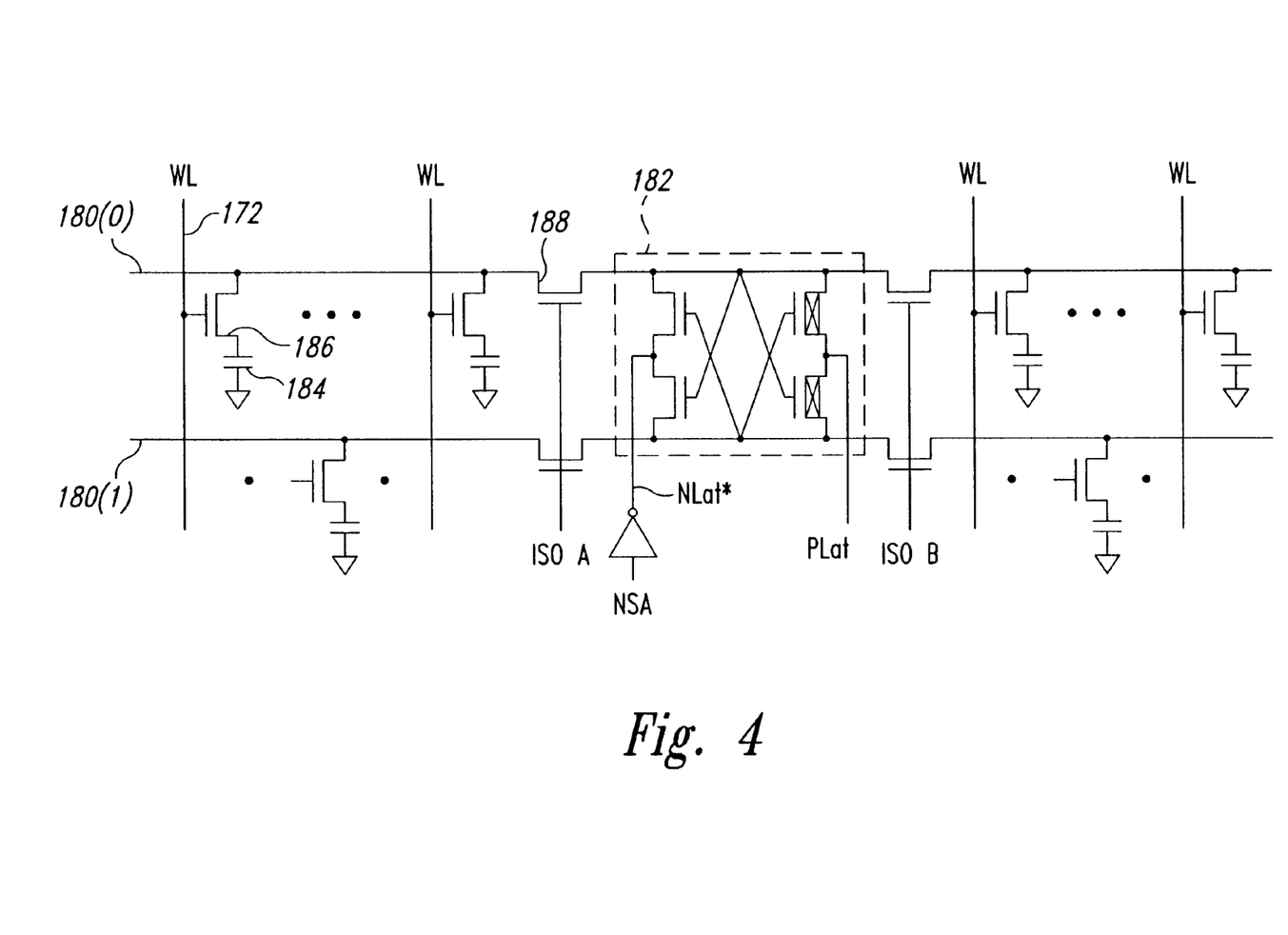
FIG. 4 is a schematic diagram of part of the memory array of FIG. 2.

FIG. 4 is a schematic diagram of a column of the memory array 110. The column schematic has been simplified to focus on the elements needed to understand the present invention. Complementary digit lines 180(0) and 180(1) are used to couple a common sense amplifier 182 with memory cells 184. The sense amplifier is known to those skilled in the art as having a cross-coupled n-sense amplifier half, and a cross-coupled p-sense amplifier half. Nlat* and PLat signals are coupled to the sense amplifier to selectively activate the cross-coupled n-sense amplifier half, and a cross-coupled p-sense amplifier half, respectively. Nlat* as illustrated is derived from an n-sense amplifier circuit signal NSA. The Nlat signal is generally the inverse of NSA, however, the Nlat* signal will typically transition between a mid-level voltage such as Vcc/2 and ground potential. Because the NSA signal transitions between Vcc and ground, however, the inverse signal NSA* shown in FIG. 5 also transitions between Vcc and ground. Because the Nlat and NSA* signals have different voltage limits each signal will use different driver circuits responsive to the NSA signal.

Access transistors 186 are selectively activated by a wordline signal provided on wordlines 172. In a read operation, a memory cell 184 is accessed through the access transistor and shares a charge stored thereon with a digit line. One of the complementary digit lines, therefore, experiences a change in voltage. The sense amplifier is then coupled to the digit line pair via optional isolation transistors 188 for sensing and amplifying a differential voltage between the digit line pair, as known to one skilled in the art.

Figure 5:
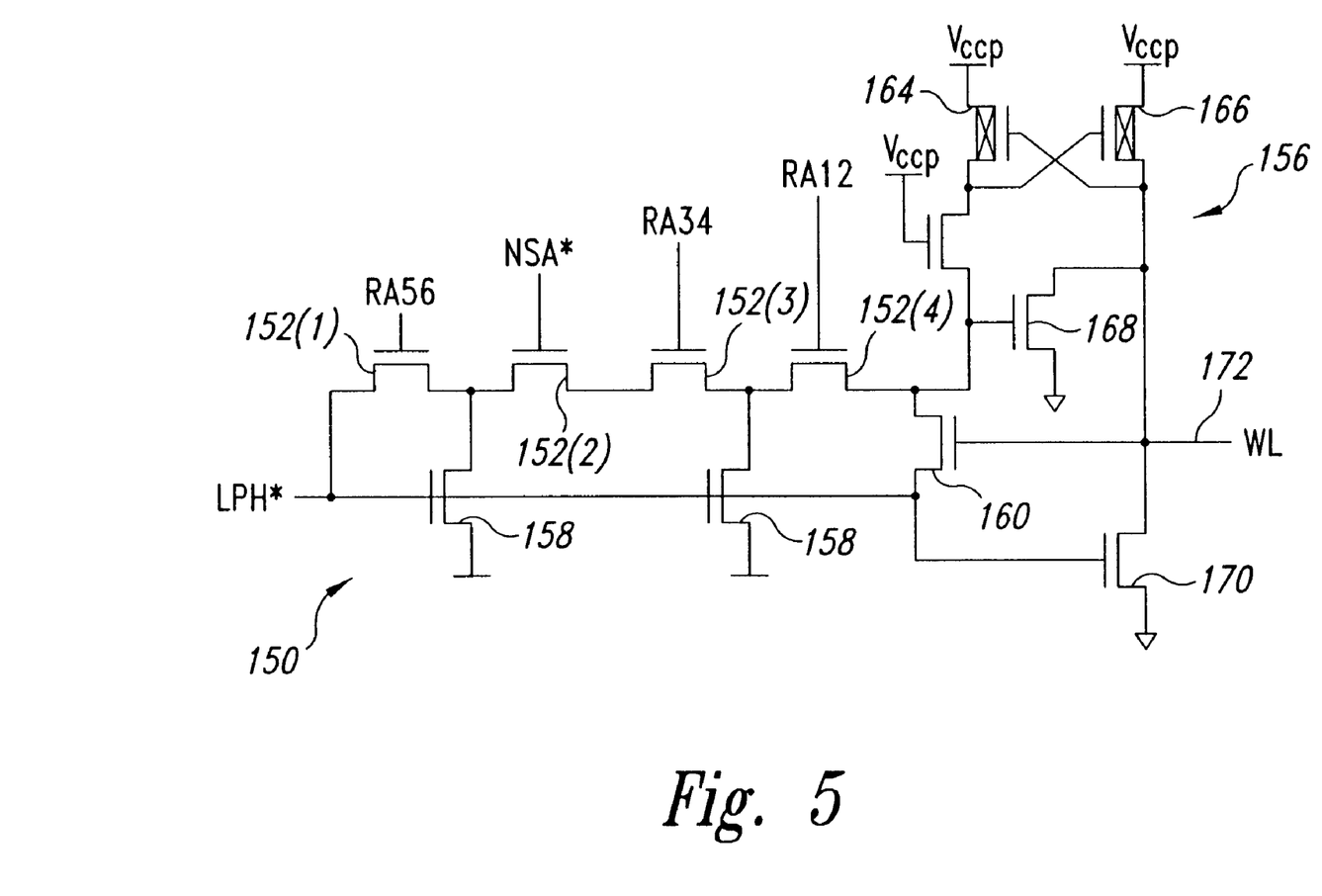
FIG. 5 is a simplified schematic diagram of a wordline driver circuit.

FIG. 5 illustrates a simplified wordline driver circuit 150 which is provided in row decode circuitry 130. The driver circuit includes pass transistors 152(1)–(4) which are activated by row address lines and NSA*. That is, row address lines RA56, RA34 and RA12 are coupled to the gates of transistors 152(1),(3) and (4), respectively. The inverse of the n-sense amplifier activation signal, NSA*, is coupled to the gate of transistor 152(2). Thus, a decode tree is provided using LPH*, NSA* and RA signals. It will be appreciated by those skilled in the art that additional stages can be added to the decode tree as needed for a particular memory architecture. A wordline signal on line 172 is controlled by level translator circuit 156, having input 154 and output 172, in response to the pass transistors and active low local phase line, LPH*. A latch transistor 160 is provided in the driver circuit to latch a high wordline signal so that row address signals can change state.

The circuit of FIG. 5 is best understood by studying its operation. The LPH* signal is normally at a high state when wordline 172 is to be inactive, or at a low state. Thus, transistors 158 are active and transistor 170 is active to couple the wordline to ground potential. Transistor 160, therefore, is turned off, and transistor 168 is turned on. That is, the gate of transistor 168 is pulled high through transistors 162 and 164. The state of the RA56, RA34 and RA12 do not effect the wordline signal while LPH* is high.

To activate wordline 172, RA56, NSA*, RA34 and RA12 must all transition to a high state to activate transistors 152 (1)–(4). Additionally, LPH* must transition to a low state and turn off transistors 158 and 170. Further, node 154 is coupled to LPH* through transistors 152. Transistor 166, therefore, is activated and pulls wordline 172 to a high state. Likewise, transistor 164 is turned off. Transistor 160 is activated when wordline 172 is pulled high. Node 154, therefore, is also coupled to LPH* through transistor 160. Transistor 152(2) is provided in the decode tree to insure that a change in the row address lines does not access another row in the same memory bank having a common local phase line signal. Any bank dependant signal can be used in place of NSA*, such as a specific bank identification signal generated by decoding address signals. The NSA* signal does not transition to an active state if a wordline in the same memory array bank is active. Therefore, after a wordline transitions to a high state within a bank and the sense amplifier latches, NSA* will transition low and disable transistor 152(2). Thereafter, the state of row address lines RA56, RA34, and RA12 can change for use in other memory array banks without effecting the wordline voltage or accessing another row in the same bank.

When LPH* returns to a high state, transistor 170 is activated to pull the wordline low and turn off transistor 160. The wordline driver circuit of FIG. 5, therefore, includes a latch to maintain an active wordline and allow row address lines to transition states. Other latching wordline driver circuits are contemplated which can achieve the desired result of latching a wordline signal to allow transitions in address line signals, but the embodiment described is preferred because it requires a limited number of transistors to implement. Further, signals other than LPH* or NSA* can be used to operate the circuit, provided they allow transitions in address signals to occur without operating errors.

Conclusion

A memory device has been described which includes latching wordline driver circuits. The wordline driver circuits include a latch responsive to phase lines of a tree decode configuration. The latch has been described as a single latching transistor which allows transitions in shared row address lines while maintaining an active wordline signal. The latching wordline driver is particularly useful in multi-bank memory devices such as a SDRAM where row address lines are shared between the memory banks.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:

a multiple bank array of memory cells;

access devices coupled to the memory cells for accessing the memory cells in response to a wordline signal; and a wordline driver circuit for generating the wordline signal in response to address signals, the wordline driver circuit including a latch for latching an active state of the wordline signal so that the wordline signal becomes independent of transitions of the address signals.

2. The memory device of claim 1 wherein the wordline driver circuit further generates the wordline signal in response to a memory bank dependant signal, and phase signals.

3. A memory device comprising:

a multiple bank array of memory cells;

access devices coupled to the memory cells for accessing the memory cells in response to a wordline signal; and a wordline driver circuit for generating the wordline signal in response to address signals the wordline driver circuit including a latch for latching an active state of the wordline signal so that the wordline signal becomes independent of transitions of the address signals the worldline driver circuit further generates the worldline signal in response to a sense amplifier activation signal, and phase signal.

4. A memory device comprising:

a multiple bank array of memory cells;

access devices coupled to the memory cells for accessing the memory cells in response to a wordline signal; and a wordline driver circuit for generating the wordline signal in response to address signals, the wordline driver circuit including a latch for latching an active state of the wordline signal so that the wordline signal becomes independent of transitions of the address signals, wherein the wordline driver circuit comprises:

a tree decode circuit for decoding address signals and phase signals;

a level translator connected to the tree decode circuit for generating a wordline signal in response to the tree decode circuit; and a latch circuit connected to the level translator for latching an active state of the wordline signal.

5. The memory device of claim 4 wherein the latch circuit is a transistor.

6. A memory device comprising:

an array of memory cells, the array arranged in multiple banks of memory cells;

address input lines shared between the multiple banks of memory cells for receiving address signals;

decode circuitry for decoding the received address signals and generating phase signals;

access devices coupled to the memory cells for accessing the memory cells in response to a wordline signal;

a wordline driver circuit for generating the wordline signal in response to the received address signals, a memory bank dependant signal and the phase signals, the wordline driver circuit including a latch for latching an active state of the wordline signal so that the wordline signal becomes independent of transitions of the address signals.

7. The memory device of claim 6 wherein the memory device is a synchronous dynamic random access memory.

8. A memory device comprising:

an array of memory cells, the array arranged in multiple banks of memory cells;

address input lines shared between the multiple banks of memory cells for receiving address signals;

decode circuitry for decoding the received address signals and generating phase signals;

access devices coupled to the memory cells for accessing the memory cells in response to a wordline signal;

a wordline driver circuit for generating the wordline signal in response to the received address signals, a sense amplifier activation signal and the phase signals, the wordline driver circuit including a latch for latching an active state of the wordline signal so that the wordline signal becomes independent of transitions of the address signals.

9. A memory device comprising:

an array of memory cells the array arranged in multiple banks of memory cells;

address input lines shared between the multiple banks of memory cells for receiving address signals;

decode circuitry for decoding the received address signals and generating phase signals;

access devices coupled to the memory cells for accessing the memory cells in response to a wordline signal;

a wordline driver circuit for generating the wordline signal in response to the received address signals, a memory array bank dependant signal and the phase signals, the wordline driver circuit including a latch for latching an active state of the wordline signal so that the wordline signal becomes independent of transitions of the address signals, the wordline driver circuit comprises:

a tree decode circuit for decoding address signals and phase signals;

a level translator connected to the tree decode circuit for generating a wordline signal in response to the tree decode circuit; and a latch transistor connected to the level translator for latching an active state of the wordline signal.

10. A latching wordline driver circuit for use in a memory device comprising:

a decode tree comprising a series of pass transistors coupled between a local phase line and an input of a level translator, the level translator having an output coupled to a wordline;

a pulldown transistor having a drain connected to the wordline and a gate coupled to the local phase line; and a latch circuit coupled between the local phase line and the input of the level translator to latch a signal on the wordline.

11. The latching wordline driver circuit of claim 10 wherein the series of pass transistors are activated by row address signals and a memory array bank signal.

12. The latching wordline driver circuit of claim 11 wherein the memory array bank signal is a sense amplifier activation signal.

13. The latching wordline driver circuit of claim 10 wherein the latch circuit is a transistor having a drain coupled to the input of the level translator, a source coupled to the local phase line, and a gate coupled to the wordline.

14. A method of accessing a memory device, the method comprising the steps of:

providing a first set of address signals to the memory device;

decoding the first address signals;

generating a first wordline signal based upon the decoded address signals;

accessing a first row of memory cells based on the first set of address signals; and latching the first wordline signal in an active state to allow transitions in the address signals.

15. The method of claim 14 wherein the step of decoding produces row address signals and phase signals.

16. The method of claim 14 further comprising the steps in the order of:

providing a second set of address signals to the memory device, after the step of latching;

decoding the second address signals;

generating a second wordline signal based upon the decoded second address signals; and accessing a second row of memory cells based on the second set of address signals.

* * * * *